(12) United States Patent
Johnson et al.

(10) Patent No.: US 6,682,994 B2
(45) Date of Patent: Jan. 27, 2004

(54) METHODS FOR TRANSISTOR GATE FORMATION USING GATE SIDEWALL IMPLANTATION

(75) Inventors: F. Scott Johnson, Richardson, TX (US); Tad Grider, McKinney, TX (US); Benjamin P. Mckee, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/123,686

(22) Filed: Apr. 16, 2002

(65) Prior Publication Data

US 2003/0194851 A1 Oct. 16, 2003

(51) Int. Cl.⁷ .................. H01L 21/3205; H01L 21/4763
(52) U.S. Cl. ................. 438/585; 438/302; 438/303; 438/306

(58) Field of Search .................. 438/299, 301–303, 438/305, 306, 308, 530, 532, 558, 585, 595, 689, 706, 724, 745

(56) References Cited

U.S. PATENT DOCUMENTS 5,966,605 A    10/1999  Ishida
6,319,798 B1 * 11/2001  Yu ........................ 438/527

* cited by examiner

*Primary Examiner*—Kamand Cuneo
*Assistant Examiner*—Asok Kumar Sarkar
(74) *Attorney, Agent, or Firm*—Peter K. McLarty; W. James Brady, III; Frederick J. Telecky, Jr.

(57) ABSTRACT

Methods are disclosed for semiconductor device fabrication in which MOS transistor gates are to be formed. Polysilicon gate structures and sidewall spacers are formed, with upper portions of the gate sidewalls exposed. Angled implantation processing is employed to impart dopants to the top and exposed sidewall portions of the gate structure to mitigate poly depletion.

22 Claims, 6 Drawing Sheets

METHODS FOR TRANSISTOR GATE FORMATION USING GATE SIDEWALL IMPLANTATION

FIELD OF INVENTION

The present invention relates generally to semiconductor devices and more particularly to methods for forming transistor gates in the manufacture of semiconductor devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a doped polysilicon gate is energized to create an electric field within a semiconductor channel underlying the gate, by which current is allowed to conduct between doped source/drain regions formed in a substrate on either side of the channel. In order to provide a conductive gate electrode, a polysilicon gate structure is patterned over the prospective channel region of the substrate and dopants are added to render the polysilicon conductive. The doping of the polysilicon gate structure is usually performed simultaneously with the doping of the source/drain regions of the substrate, typically through implantation processing. The doped polysilicon gate structure overlies a thin gate dielectric layer formed over the channel substrate.

The gate dielectric is an insulator material, which prevents large currents from flowing from the gate into the channel when a voltage is applied to the gate contact, while allowing such an applied gate voltage to set up an electric field in the channel region in a controllable manner. In operation, the resistivity of the channel may be controlled by the voltage applied to the doped gate structure, by which changing the gate voltage changes the amount of current through the channel. The doped polysilicon gate structure and the channel are separated by the gate dielectric, which is an insulator. Thus, little or no current flows between the gate and the channel. However, the gate dielectric allows the gate voltage to induce an electric field in channel, by which the channel resistance can be controlled by the applied gate voltage.

In the manufacture of such devices, there is a continuing trend toward higher device densities, and hence smaller and smaller device dimensions. Generally, device density is improved by scaling or decreasing the size of the transistors and other electrical components. In this continuing process, it is desirable to provide sufficient polysilicon doping to accommodate the smaller device sizes. In addition, although generally scaled to be smaller, certain devices require larger feature sizes than others, including gate dimensions. Typically, the doping of the polysilicon gate structures is performed in a single implantation step across all the polysilicon gate structures in a semiconductor device.

After the polysilicon is doped, subsequent processing of the semiconductor device may lead to a depletion of dopants in selected regions of the polysilicon ("dopant depletion"). This is typically due to out-diffusion of the dopants into either the ambient or surrounding films during high processing at elevated temperatures. This loss of dopants is proportional to the polysilicon surface area and results in a reduction in the average doping at the polysilicon-gate dielectric interface at the completion of the processing. This condition, referred to as "poly depletion", causes an increase in the region of polysilicon that is depleted of carriers when the gate is biased to allow accumulation in the MOS channels. The increase in the effective thickness of the gate oxide under the inversion condition has the effect of an increase in threshold voltage and reduction in gate capacitance, in turn causing a reduction in transistor drive current and increased logic gate delay and processing time.

In order to provide process uniformity and control over individual device performance, it is desirable to ensure that the dopant concentrations in all the gate structures be the same in both small and large polysilicon gate structures when the manufacturing process is completed. Accordingly there is a need for processes and methodologies by which poly depletion can be mitigated or controlled in order to reduce the dopant loss and to improve uniformity for end-of-process poly gate dopant concentration across devices having different gate dimensions.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to methods for fabricating semiconductor devices directed to mitigating the adverse effects of poly depletion. One aspect of the invention provides for doping the top and upper portions of the sidewalls of polysilicon gate structures in a semiconductor device, so as to mitigate the effects of depletion of dopants in subsequent processing steps. In this regard, the inventors have appreciated that dopant depletion affects smaller polysilicon gate structures differently than larger polysilicon structures due to edge induced dopant losses. The methodologies of the invention advantageously dope portions of the sidewalls of poly gate structures so as to mitigate the effect of such edge induced dopant losses, by which the uniformity of dopant concentrations across poly gates of differing dimensions may be improved. In one implementation, dopants are provided to the sidewalls of the polysilicon gates via an angled implantation process, by which the amount of dopants introduced at the sidewall edges is increased. In one example, the implantation into the sidewalls may be facilitated by provision of sidewall spacers, which cover a lower portion of the sidewalls and leave an upper portion exposed to the implantation process.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention involves doping of polysilicon gate structure sidewalls or portions thereof to control or counteract the depletion of dopants from the finished gate structure, as well as to facilitate uniformity in poly depletion in the manufacture of semiconductor devices. Toward that end, the invention may be implemented by doping side portions of poly gate structures via angled implantation processes using sidewall spacers exposing upper portions of the gate sidewalls. The invention may advantageously be implemented during source/drain implantation processing using disposable sidewall spacers prior to LDD implantation, or alternatively may be employed in conjunction with processes where the LDD implantation is performed first.

Referring initially to FIGS. 1A–1D, a high degree poly depletion occurs when an insufficient amount of dopant is introduced to the poly gate region nearest the gate oxide. This can be due to an insufficient amount of dopants being introduced to the polysilicon, or to the anneal subsequent to the doping of a poly gate being insufficient to drive the implanted impurities down the entire depth of the poly gate. Because the amount of dopant and the degree of annealing can be limited by other practical manufacturing considerations, such as dopant diffusion in other regions of the transistor structure, most often both of these factors contribute significantly.

Consequently, a portion of the poly gate nearest the underlying gate oxide is depleted of carriers and behaves as an insulating region. As a result, the transistor behaves as though the gate oxide is substantially thicker, leading to lower drive current capability and higher threshold voltages for the devices. The inventors have appreciated that depletion of P-type or N-type dopants from polysilicon gate structures may be aggravated by reduction in the length or width of such structures through edge induced dopant loss. In this regard, as gate lengths and widths decrease, a larger percentage of the polysilicon gate volume is proximate the edges, whereby such edge induced dopant losses become more and more significant to the final device performance.

Figure 1A:
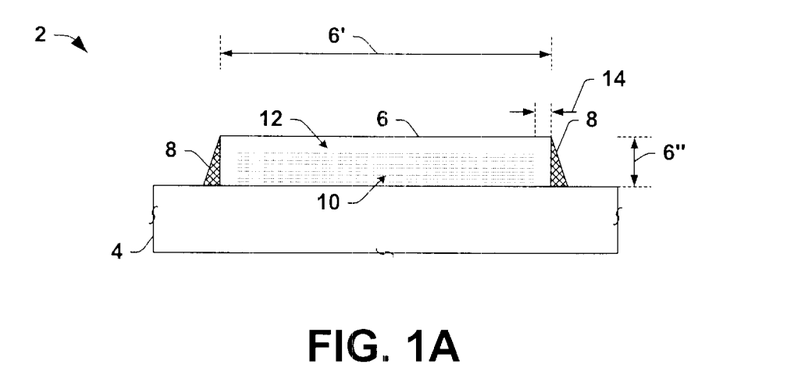
FIG. 1A is a partial side elevation view in section illustrating a relatively long polysilicon gate structure at an intermediate stage in the fabrication of a semiconductor device, wherein dopant concentration has been depleted proximate the sidewalls.
Figure 1B:
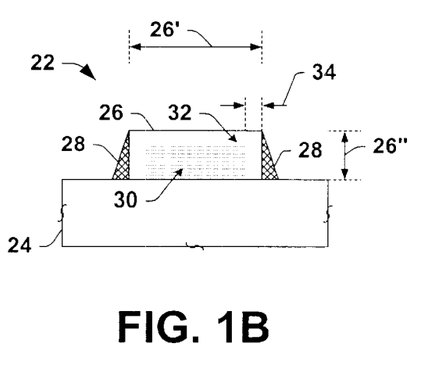
FIG. 1B is a partial side elevation view in section illustrating an intermediate length polysilicon gate structure, wherein dopant concentration has been depleted proximate the sidewalls, resulting in overall depletion of a greater percentage of dopants than in the structure of FIG. 1A.
Figure 1C:
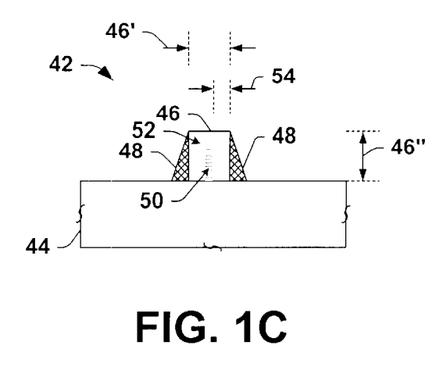
FIG. 1C is a partial side elevation view in section illustrating a relatively short polysilicon gate structure, wherein dopant concentration has been depleted proximate the sidewalls, resulting in overall depletion of a greater percentage of dopants than in the structures of FIGS. 1A and 1B.

As an illustration, FIGS. 1A–1C show polysilicon gate structures having successively shorter lengths, at an intermediate stage of fabrication. In FIG. 1A, a semiconductor device 2 is illustrated wherein a polysilicon gate structure 6 is formed over a substrate 4 having a relatively long length 6' of about 10 um and a height 6" of about 100 nm. Sidewall spacers 8 are formed adjacent sidewalls of the gate structure 6 in order to protect the underlying channel region of the substrate 4 during implantation of the gate 6 and prospective source/drain regions of the substrate 4. The polysilicon gate 6 is illustrated following implantation of dopants therein and subsequent processing, by which dopants having a relatively high concentration are found in a first region 10, whereas lower dopant concentrations are found in a second region 12 near the top and side edges and extending a distance 14 therefrom in the gate 6. The illustrations herein are not necessarily drawn to scale, at it will be appreciated that although the dopant concentrations in the regions 10 and 12 are illustrated as generally constant, the actual concentrations are likely to be profiled.

The inventors have appreciated that the dopant losses in the region 12 are caused, at least in part, by various processing steps used in fabricating the device 2 following dopant implantation in the gate structure 6, referred to herein as edge induced dopant losses. For example, the inventors have found that growing oxides causes depletion of the poly dopant concentration from the region 12 near the top and sides of the structure 6. It is believed that when the device 2 is placed in an oxidation chamber, dopants are lost to the oxidizing ambient through outgassing from the region 12 prior to formation of oxide. In addition, it is believed that when oxides form on the top and exposed sidewalls of the poly gate structure 6, that further dopant is lost from the region 12 through diffusion thereof into the oxide. Furthermore, the inventors have appreciated that dopants are lost near the edges of the structure 6 during silicidation, where dopants diffuse during annealing into the cobalt, titanium, nickel, or other materials used in such processing.

Referring also to FIG. 1B, another device 22 is illustrated in which a somewhat narrower polysilicon gate structure 26 is formed over a substrate 24 having a length 26' of about 1 um less than the length 6' of the structure 6 in FIG. 1A, and a height 26" similar to the height 6" (e.g., about 100 nm). Sidewall spacers 28 are formed along the sidewalls of the gate 26, and the gate 26 has been implanted with dopants. Through subsequent processing steps (not shown), the above mentioned and/or other edge induced dopant losses result in dopants having a relatively high concentration being found in a first region 30, with lower concentrations being found in a second region 32 near the top and side edges and extending a distance 34 therefrom in the gate 26. As illustrated, the distance 34 is generally similar to the distance 14 of FIG. 1A, whereby the edge related dopant loss as a percentage of the total volume of the structure 26 is proportionally higher in the relatively narrower gate 26, compared with the long length gate 6 of FIG. 1A. Thus, the inventors have appreciated that such edge induced dopant losses are more detrimental as device sizes (e.g., gate lengths and/or widths) continue to decrease.

In FIG. 1C, another device 42 is illustrated in which an even smaller polysilicon gate structure 46 is formed over a substrate 44 having a length 46' of about 0.1 um (e.g., less than the lengths 6' and 26' in FIGS. 1A and 1B), and a height 46" of about 100 nm (e.g., similar to the heights 6" and 26"), and with sidewall spacers 48 formed along the gate sidewalls. The gate 46 has been implanted with dopants and subsequently processed whereby edge induced dopant losses have occurred. As a result, a relatively high concentration of dopants are found in a first region 50 and lower concentrations are found in a second region 52 extending a distance 54 from the edges of the gate structure 46. As can be appreciated from FIG. 1C, these edge induced losses have become a significant limitation in the dopant concentration in the final gate structure, due to the scaling of the gate length 46'. It will be further noted from FIGS. 1A–1C, that where devices having different gate lengths are formed on a single device, the edge induced dopant losses will impact the final gate dopant concentrations differently. In this regard, the inventors have appreciated that countermeasures are needed to facilitate control over final gate dopant concentrations, as well as consistency thereof across devices of differing gate dimensions.

Figure 1D:
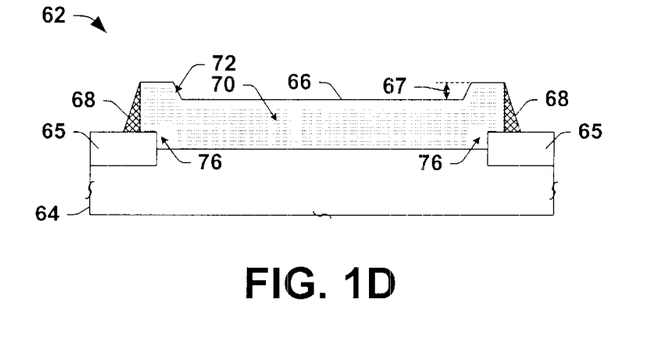
FIG. 1D is a partial side elevation view in section illustrating the width of a polysilicon gate structure extending over topographic isolation structures. In this situation, the higher volume of polysilicon over the isolation topography due to the conformal deposition of polysilicon combined with the perfectly planar nature of the ion implant process that is used to introduce dopant atoms to the top surface of the polysilicon, combine to result in a reduced density of dopant in the volume of polysilicon proximate the isolation structures.

Referring also to FIG. 1D, it has been found that edge induced dopant losses are also found in situations where gate structures are formed over or near topographical features, such as isolations structures. FIG. 1D illustrates a polysilicon gate structure 66 extending over topographic isolation structures 65. In this situation, the higher volume of polysilicon over the isolation topography due to the conformal deposition of polysilicon combined with the perfectly planar nature of the ion implant process that is used to introduce dopant atoms to the top surface of the polysilicon 66 result in a reduced density of dopant in the volume of polysilicon proximate the isolation structures 65.

In FIG. 1D, a semiconductor device 62 is illustrated comprising a polysilicon gate structure 66 formed over a substrate 64, having a gate width extending between and partially overlying two isolation structures 65, with sidewall structures 68 along the endwalls thereof. As discussed above, processing steps following gate dopant implantation result in edge induced dopant losses, by which a relatively high concentration of dopants are found in a first region 70 and lower concentrations are found in a second region 72 extending near the top and endwalls of the gate 66. In addition, the formation of the gate ends over the STI structures 65 results in a step in the gate 66 having a step height 67. The inventors have found that the step caused by the topography in these situations also leads to edge induced dopant losses near the STI structures 65, wherein regions 76 have lower finished product dopant concentrations than are found in the interior region 70.

The above-mentioned edge induced dopant losses contribute to the overall loss of dopant concentrations in finished polysilicon gate structures. As is known, the dopant loss degrades transistor performance characteristics, such as drive current capabilities, threshold voltages, and the like. Therefore, it is desirable to mitigate the dopant loss or to otherwise compensate for such losses in the fabrication of semiconductor integrated circuits. Furthermore, it is desirable to provide uniformity in the dopant concentrations across devices having different polysilicon gate structure dimensions, such as where some transistors have smaller gates than others in a given device. While attempts have been made at reducing or mitigating the actual losses, the inventors have appreciated that the introduction of additional dopants may be employed as a countermeasure, by which end process dopant concentrations can be achieved even where such poly depletion is encountered in processing following initial gate doping.

The present invention involves doping of sidewall areas or regions of polysilicon gate structures so as to counteract or mitigate the adverse effects of poly depletion. As illustrated above, the edge induced dopant losses become more and more significant as device sizes continue to shrink. The inventors have found that providing dopants to the sidewalls of polysilicon gate structures may be employed to yield higher and more consistent end-of-process dopant concentrations than previously possible using conventional gate doping techniques. Various methodologies may be employed to provide dopants to the gate sidewalls in accordance with the invention, some of which are illustrated and described hereinafter. In one example, discussed below in association with FIGS. 3–10, a disposable sidewall spacer is formed along a lower sidewall portion of the polysilicon gate, leaving an upper sidewall portion exposed. An angled dopant implantation process is then employed to impart dopants to the top and exposed upper sidewalls at an angle with respect to the sidewall surfaces. This effectively provides additional dopants to compensate for dopant diffusion and/or outgassing losses in subsequent processing of the device. The disposable sidewall spacer may be removed subsequent to the implantation, and other sidewalls formed to cover all or most of the gate sidewalls during subsequent silicidation processing.

Figure 2:
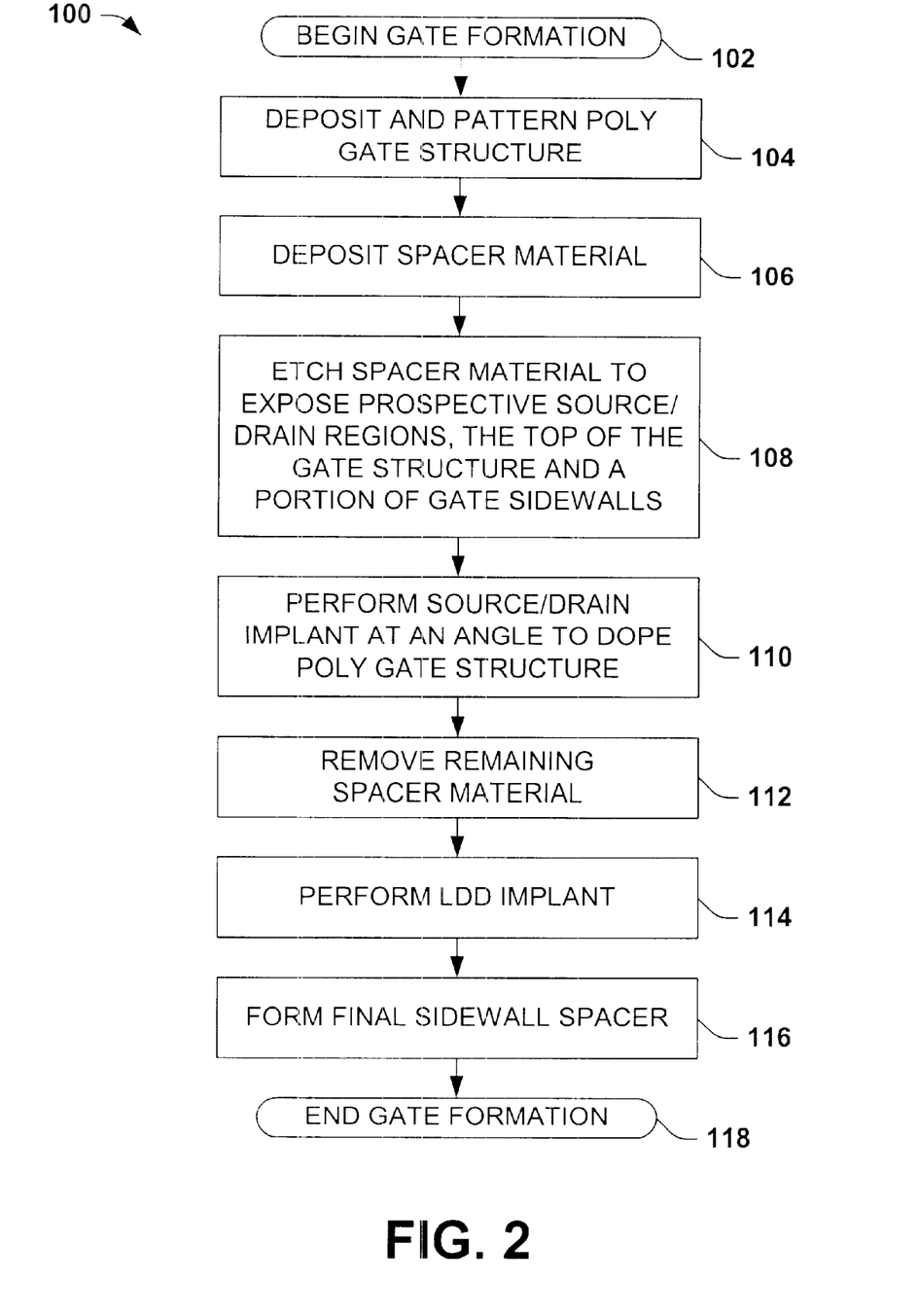
FIG. 2 is a flow diagram illustrating an exemplary method of forming polysilicon gate structures in accordance with the present invention.

The invention provides methodologies for forming transistors and gate structures therefor during semiconductor device fabrication. One exemplary method 100 for forming gate structures is illustrated in FIG. 2, wherein dopants are provided to at least an upper portion of the gate sidewall using an angled implantation in accordance with the present invention. While the method 100 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

Beginning at 102, a polysilicon gate structure is formed over a substrate at 104, wherein a polysilicon material layer is deposited and subsequently patterned, for example, using known polysilicon deposition techniques and lithography processes. The resulting gate structure at 104 comprises a top and sidewalls. The formation of the gate structure at 102 may be done following formation of a gate oxide material (not shown) over the substrate surface using known oxidation techniques. At 106, a spacer material is deposited, such as oxide or nitride material, and at 108 the spacer material is etched so as to expose the top and an upper portion of the gate sidewalls, for example, using an etch process selective to polysilicon. The etch may further expose the substrate in prospective source/drain regions of the device. In this manner, a sidewall spacer is formed at 106 and 108 adjacent to and covering a lower portion of the gate sidewalls proximate the substrate, leaving the upper portion of the sidewalls exposed. In one implementation, the sidewall spacer covers about a lower one half of the height of the sidewall. Other implementations are possible within the scope of the invention, for instance, wherein the sidewall spacer covers about a lower 600 Å or more of the sidewall, so as to protect a prospective channel region of the substrate underlying the gate structure.

Thereafter at 110, the polysilicon gate structure is doped using an angled implantation process. The implantation at 110 may also be used to dope exposed prospective source/drain regions of the substrate, using the sidewall spacers to protect the underlying channel region. The implantation process may be performed using any known implantation species such as boron, arsenic, phosphorus or others, so as to dope the source/drain regions, and to render the polysilicon gate structure conductive. Any appropriate implantation equipment may be used, with the relative orientation between the ion implanter and the substrate controlled so as to provide dopants to at least the upper portion of the sidewall at a non-zero angle with respect to the sidewall. For example, one implementation of the invention provides dopants to the sidewall (e.g., as well as to the prospective source/drain regions of the substrate and the top of the gate structure) at an angle of about 10 degrees or more and about 45 degrees or less.

Following the angled implantation at 110, the remaining sidewall spacer material is removed at 112, such as via an etch process selective to polysilicon, and at 114 a lightly doped drain (LDD) implantation is performed. The LDD implant may be used, for example, to further implant a shallow portion of the substrate in the source/drain regions using the polysilicon gate structure for self-alignment. In this regard, the implantation at 114 may also provide dopants to the gate structure. At 116, final sidewall spacers are formed, such as by deposition and etching processes as are know, in order to provide sidewall spacers for isolation purposes during subsequent silicidation processing (not shown), before the method 100 ends at 118.

Thus, in the exemplary method 100 of FIG. 2, disposable or temporary sidewall spacers are formed at 106, 108, and used during the angled source/drain implantation at 110 to allow dopants to be implanted into the gate top and upper portions of the gate sidewalls, before being removed at 112. In order to facilitate proper silicidation following the method 100, the final sidewall spacers are then formed at 116, which may extend upward from the substrate to cover most or all of the gate sidewalls. The invention contemplates the use of any appropriate sidewall spacer material, and appropriate etching processes in the formation and removal thereof as are known.

For example, a composite disposable spacer may be formed such as through deposition or growth of a thin oxide over the substrate and the gate structure, followed by formation (e.g., deposition) of a nitride layer overlying the oxide. In this implementation, disposable sidewall spacers are then formed at 106 and 108 by deposition and patterning of an oxide material, wherein the etch processes at 108 and 112 are selective to nitride during formation and removal of the spacer materials. In another possible implementation, a nitride spacer material, such as $Si_3N_4$ is deposited at 106 over an initial oxide layer overlying the substrate and polysilicon gate structure, wherein the nitride spacer is then formed at 108 using an etch process selective to oxide. Thereafter at 112, the remaining nitride spacer material is again etched using an etch process selective to oxide. It will be appreciated that these are but two possible implementations, and that other implementations apart from those illustrated and described herein are contemplated as falling within the scope of the present invention.

Figure 3:
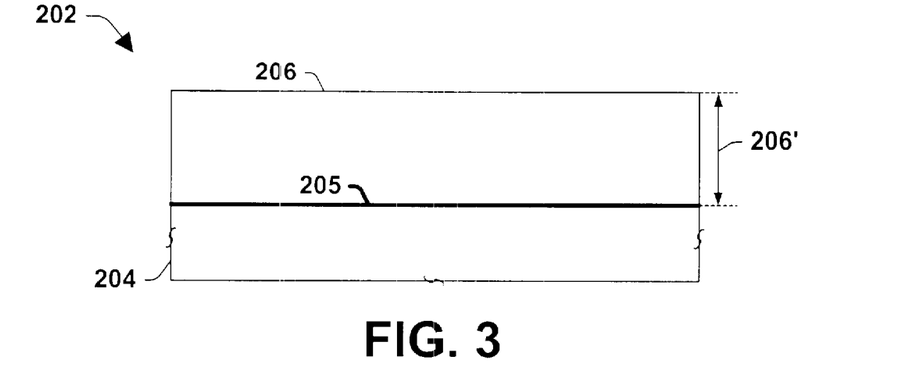
FIG. 3 is a partial side elevation view in section illustrating formation of a polysilicon layer over a substrate during gate fabrication in accordance with an exemplary implementation of the invention.
Figure 4:
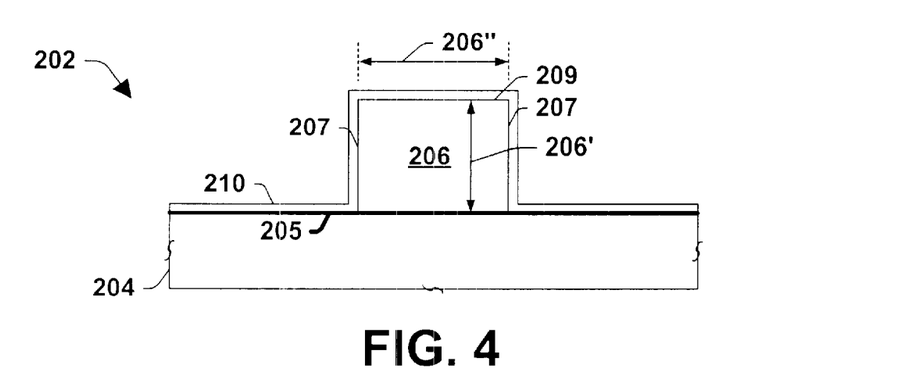
FIG. 4 is a partial side elevation view in section illustrating a patterned polysilicon gate structure in the device of FIG. 3, having an oxide layer formed thereover.
Figure 5:
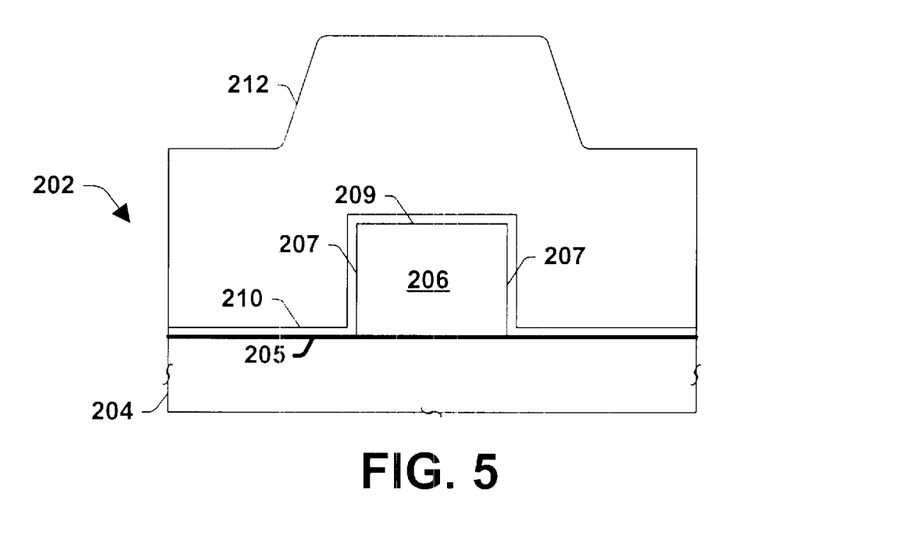
FIG. 5 is a partial side elevation view in section illustrating formation of a nitride spacer material over the patterned polysilicon gate structure of FIG. 4.

In order to further appreciate the various aspects of the invention, FIGS. 3–10 illustrate an exemplary semiconductor device 202 processed according to one implementation of the invention, wherein disposable nitride spacers are employed during a source/drain implant to allow provision of dopants to at least an upper portion of the polysilicon gate sidewalls. In FIG. 3, a substrate 204 is provided with a thin gate oxide layer 205 grown thereover using known thermal oxidation techniques. A polysilicon material 206 is deposited as a layer over the gate oxide 205 as illustrated in FIG. 3, and then patterned using appropriate photolithographic processing techniques (not shown), leaving the patterned polysilicon gate structure 206 of FIG. 4 having a height 206' and a length 206" with sidewalls 207 and a top 209. In the present example, an oxide layer 210 is then formed over the gate structure 206 and the remainder of the substrate 204 as illustrated in FIG. 4, and a nitride spacer material 212, such as $Si_3N_4$, is deposited as a layer as illustrated in FIG. 5.

Figure 6:
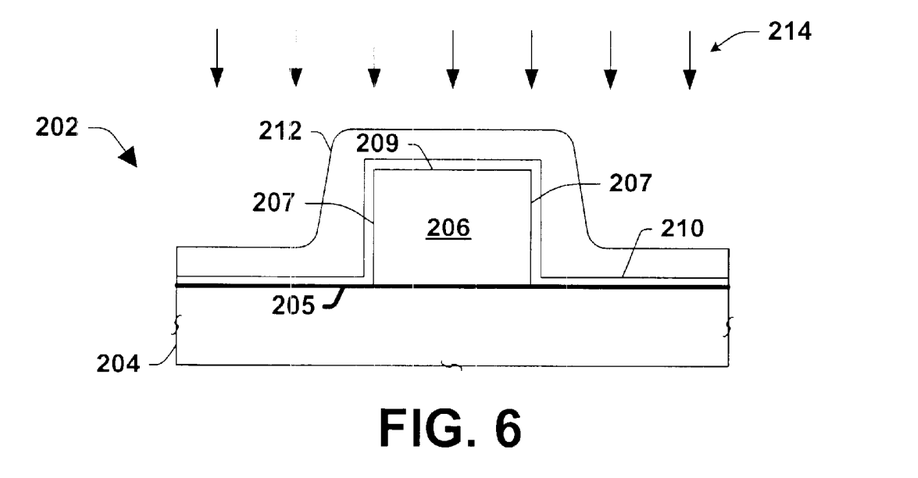
FIGS. 6–8 are partial side elevation views in section illustrating etching of the spacer material to form sidewall spacers adjacent sidewalls of the polysilicon gate structure.
Figure 7:
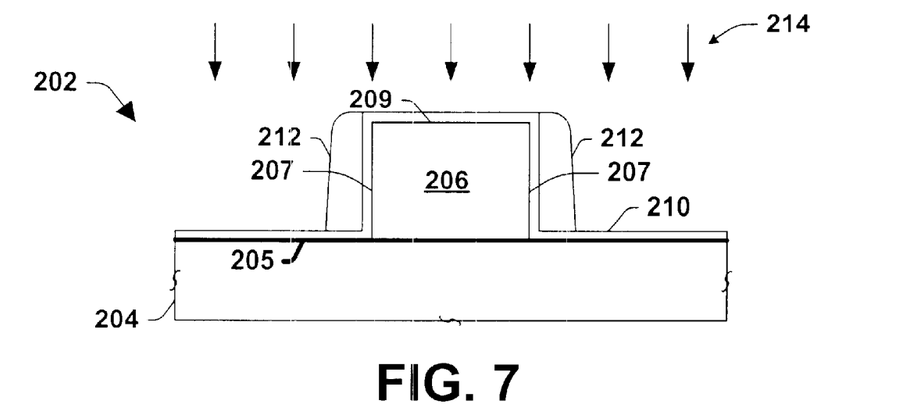
Figure 8:
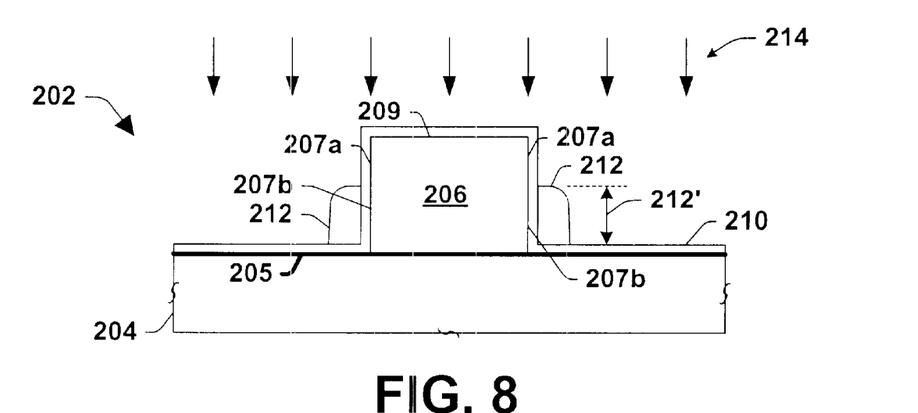

In FIGS. 6–8, an etch process 214 is employed to selectively remove a portion of the spacer material 212 to expose the upper portion of the sidewalls 207 and the top 209 of the polysilicon gate structure 206 (although the sidewalls 207 and the top 209 are still covered with the oxide 210). In this implementation, the etch process 214 is selective to the oxide layer 210, and is continued past the point in FIG. 7 where the portion of the layer 210 overlying the top 209 is initially exposed. The process 214 is continued to a point in FIG. 8 where upper portions 207a of the sidewalls 207 are exposed through the oxide layer 210 and lower portions 207b thereof remain covered by the sidewall spacers 212.

The etch process 214 is stopped as illustrated in FIG. 8 to leave the upper sidewall portions 207a exposed down to about half way between the top 209 and the surface of the substrate 204, wherein the sidewall spacers 212 have a final height 212'; However, other implementations are contemplated within the scope of the invention, wherein the exposed upper portions 207a extend above or below the halfway point of the gate height 206'. In this regard, the invention contemplates any appropriate sidewall spacer height 212', such as about 600 Å or more, by which the upper portions 207a are exposed, and the lower portions 207b (e.g., and the underlying prospective channel region of the substrate 204) are covered during subsequent implantation processing. In this regard, the inventors have found that exposure of the upper sidewall portions 207a facilitates providing dopants thereto, particularly in combination with an angled implantation process, as illustrated and described in greater detail below with respect to FIG. 9. It is further noted in FIGS. 7 and 8 that the etch process 214 also operates to expose a portion of the semiconductor substrate 204 in prospective source/drain regions.

Figure 9:
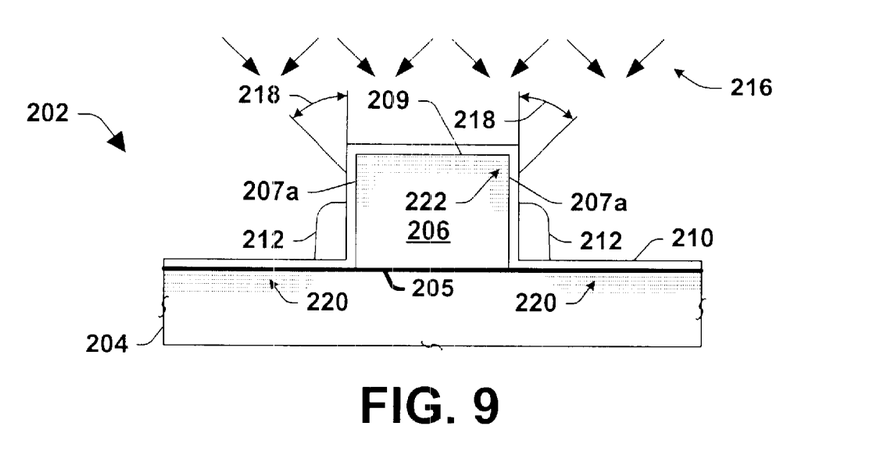
FIG. 9 is a partial side elevation view in section illustrating a source/drain implantation process providing dopants to the exposed upper portions of the sidewalls at an angle in accordance with an aspect of the invention.

In FIG. 9, the gate structure 206 and the prospective source/drain regions of the substrate 204 are doped using an angled implantation process 216 to provide dopants such as boron, arsenic, phosphorus or others to the exposed upper sidewall portions 207a at a non-zero angle 218 with respect to the sidewalls 207. The process 216 provides dopant species to the top 209 and sidewalls 207 of the gate structure 206 as well as to exposed portions of the substrate 204, whereby dopants are concentrated in a region 222 extending along the top 209 and the exposed sidewall portions 207a of the gate 206, as well as in source/drain regions 220 in the substrate 204.

In this regard, the angled implantation process 216 may be performed using known implantation equipment, with the relative orientation between the implantation apparatus and the substrate being controlled such that dopants are provided thereto at an angle 218 with respect to the sidewalls 207, and the endwalls (not shown) of the gate structure 206. For example, in the exemplary implementation of FIG. 9, dopants are provided at an angle 218 of about 10 degrees or more and about 45 degrees or less with respect to vertical. The implantation process 216, moreover, may be accomplished as a four step process, wherein the device 202 is rotated about 90 degrees with respect to a vertical axis between implants, with the implantation apparatus situated to provide ions thereto at the angle 218 with respect to such a vertical axis. In such a configuration, ions may be imparted onto the workpiece at the angle 218 relative to all vertical features such as the illustrated sidewalls 207 and end walls (not shown) of the gate structure 206, as well as to gate structures not aligned parallel with the gate sidewalls 207 illustrated in FIG. 9.

Figure 10:
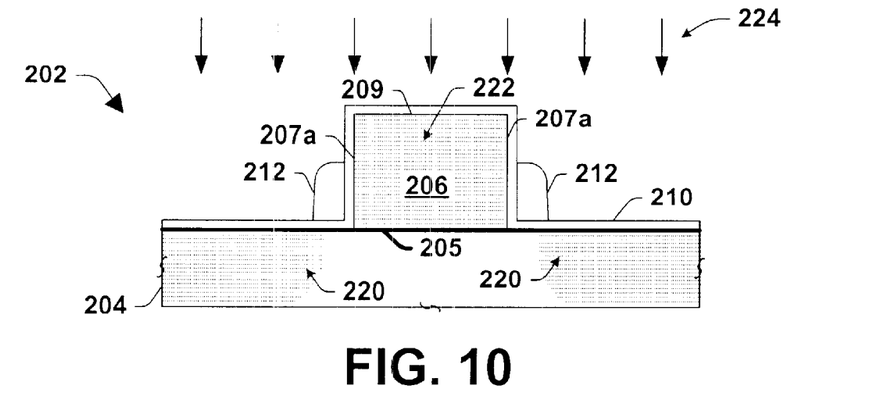
FIG. 10 is a partial side elevation view in section illustrating an annealing process following the source/drain implantation of FIG. 9.
Figure 11:
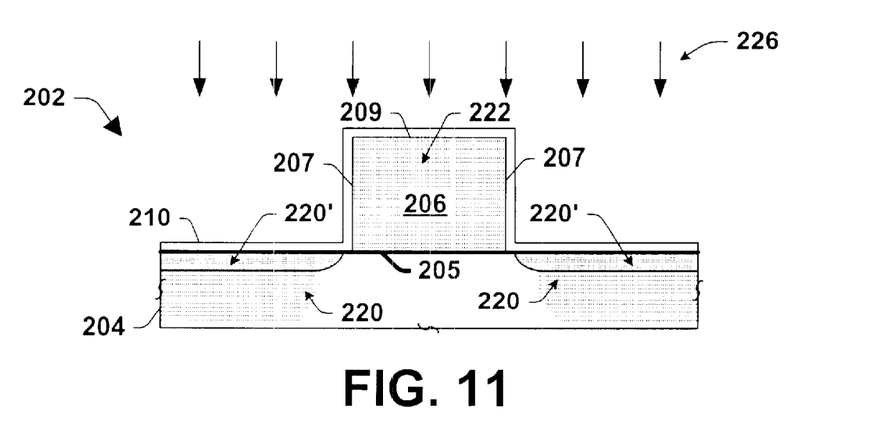
FIG. 11 is a partial side elevation view in section illustrating an LDD implantation following removal of the sidewall spacers.

In FIG. 10, a thermal anneal process 224 is performed to diffuse the implanted dopants from the region 222 further into the polysilicon 206, as well as to diffuse dopants downward into the substrate 204 to further define the source/drain regions 220. It will be appreciated that the regions 222, 220, as well as other features illustrated in the figures are not necessarily drawn to scale, and further that the dopant concentrations in the regions 222, 220 need not be constant, but rather may be profiled. The remaining sidewall spacer material 212 is then removed and an LDD implantation process 226 is performed in FIG. 11 so as to further implant shallow portions 220' of the substrate in the source/drain regions 220 using the polysilicon gate structure 206 for self-alignment of the regions 220', wherein the LDD implantation 226 may also provide dopants to the gate structure 206. Thereafter, other processing steps may be performed, such as anneal of the LDD regions 220', formation of final sidewall spacer structures (not shown), and silicidation processing using techniques known in the art.

Figure 12:
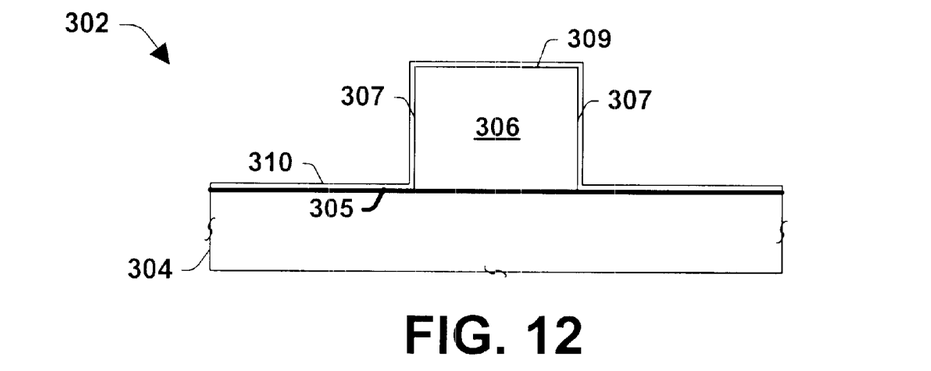
FIG. 12 is a partial side elevation view in section illustrating another semiconductor device having a patterned polysilicon gate structure with an overlying oxide layer.
Figure 13:
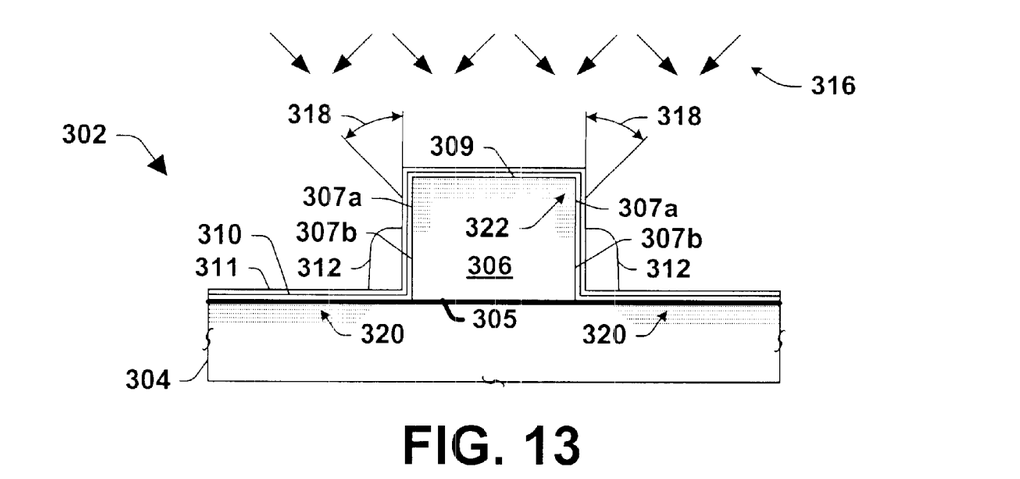
FIG. 13 is a partial side elevation view in section illustrating the device of FIG. 12 having a nitride layer over the oxide layer and oxide sidewall spacers covering lower portions of the gate sidewalls and exposing upper portions thereof to an angled implantation according to the invention.
Figure 14:
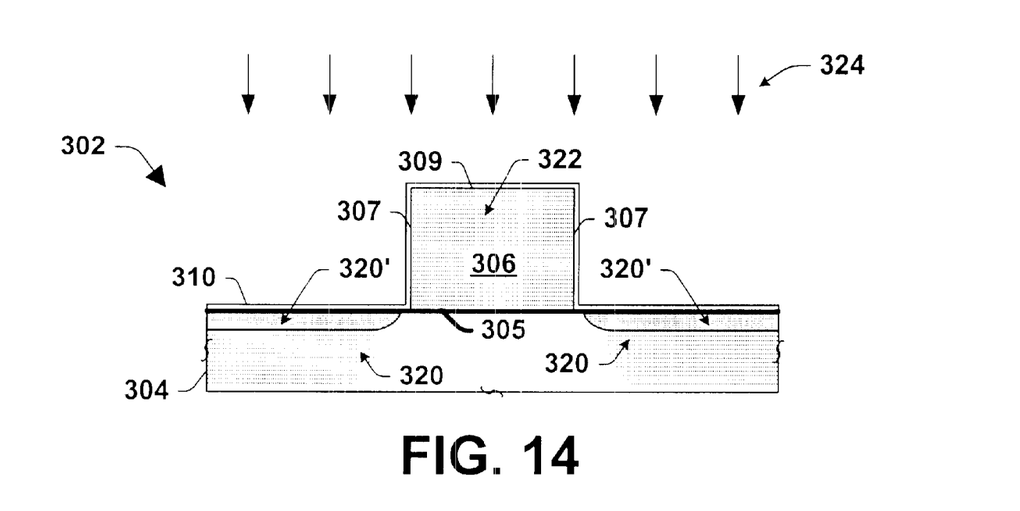
FIG. 14 is a partial side elevation view in section illustrating a subsequent LDD implantation of the device of FIG. 13.

Referring now to FIGS. 12–14, the invention may also be employed in association with composite disposable sidewall spacers, wherein a semiconductor device 302 is illustrated having a gate oxide layer 305 formed over a semiconductor substrate 304. A polysilicon gate structure 306 is formed overlying the gate oxide 305, such as by deposition and lithographic processing (not shown), having a top 309 and sidewalls 307, and an oxide layer 310 overlies the gate structure 306 and the remainder of the substrate 304. As illustrated in FIG. 13, a nitride layer 311 is deposited over the oxide 310, after which disposable oxide sidewall spacers 312 are formed adjacent lower portions 307b of the gate sidewalls 307, leaving upper sidewall portions 307a exposed. The spacers 312 are formed by deposition of a layer of oxide material and subsequent etching using an etch process selective to nitride, which is continued until the upper portions 307a are thus exposed. As with the above implementations, the sidewall spacers 312 may be formed to any appropriate height such that the upper portions 307a are exposed, such as about 600 Å or more.

Thereafter in FIG. 13, an angled implantation process 316 is employed to dope the gate structure 306 and prospective source/drain regions 320 of the substrate 304. The process 316 provides dopants such as boron, arsenic, phosphorus or others to the exposed upper sidewall portions 307a at a non-zero angle 318 with respect to the sidewalls 307. The process 316 imparts dopants to the top 309 and sidewalls 307 of the gate 306 as well as to the exposed portions of the substrate 304. In this manner, dopants are concentrated in a region 322 extending along the top 309 and the exposed sidewall portions 307a of the gate 306, as well as in source/drain regions 320 in the substrate 304, wherein the angled implantation process 316 may be performed in similar fashion to the process 216 described above with respect to FIG. 9.

Thereafter, the sidewall spacers 312 are removed, such as using an etch process (not shown), and a thermal anneal process (not shown) is performed to diffuse the implanted dopants from the region 322 further into the polysilicon gate structure 306, as well as to diffuse dopants downward into the substrate 304 to further define the source/drain regions 320. In FIG. 14, an LDD implantation process 324 is performed to further implant shallow portions 320' of the substrate in the source/drain regions 320 and to provide further dopants to the gate structure 306. Following the LDD implantation 324, further processing steps (not shown) are carried out, for example, to form final sidewall spacer structures (not shown), and silicidation processing as is known.

The invention thus may be carried out in association with a variety of sidewall spacer materials and structures, whereby dopants are provided to at least a portion of the polysilicon gate structure. In this regard, the angled implantation processing and the exposure of upper sidewall portions using reduced height sidewall spacers may be employed alone or in combination in accordance with the invention, and it will be appreciated that the invention is not limited to the implementations illustrated and described herein. Furthermore, the invention may be employed in association with non-disposable sidewall spacer structures. For example, such sidewall spacer structures may be formed to leave upper sidewall portions exposed to implantation processes (e.g., including but not limited to source/drain implants and/or LDD implants) to provide dopants to the sidewalls or portions thereof. Following such implantation, the sidewall spacer structures may thereafter be built up, such as through further deposition and etching, to form sidewall spacers covering most or all of the gate sidewalls prior to silicidation processing.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming a transistor gate in a semiconductor device, the method comprising:

forming a polysilicon gate structure over a semiconductor substrate, the polysilicon gate structure comprising a top and a sidewall;

forming a sidewall spacer adjacent a lower portion of the sidewall proximate the substrate leaving the upper portion of the sidewall exposed prior to doping the polysilicon gate structure; and doping the polysilicon gate structure using an angled implantation process providing dopants to at least an upper portion of the sidewall.

2. The method of claim 1, wherein forming the sidewall spacer comprises:

depositing spacer material over the polysilicon gate structure and the semiconductor substrate; and removing a portion of the spacer material to expose the upper portion of the sidewall and the top of the polysilicon gate structure.

3. The method of claim 2, wherein removing a portion of the spacer material comprises performing an etch process to expose the upper portion of the sidewall and the top of the polysilicon gate structure.

4. The method of claim 2, wherein removing a portion of the spacer material comprises performing an etch process to expose a portion of the semiconductor substrate in a prospective source/drain region, the upper portion of the sidewall, and the top of the polysilicon gate structure using the etch process prior to doping the polysilicon gate structure.

5. The method of claim 4, wherein doping the polysilicon gate structure comprises performing an implantation process to provide dopants to at least the upper portion of the sidewall at a non-zero angle with respect to the sidewall.

6. The method of claim 5, wherein the angle is about 10 degrees or more and about 45 degrees or less.

7. The method of claim 6, wherein performing the implantation process comprises providing dopants to the exposed portion of the semiconductor substrate in the prospective source/drain region, the upper portion of the sidewall, and the top of the polysilicon gate structure.

8. The method of claim 1, wherein doping the polysilicon gate structure comprises performing an implantation process to provide dopants to at least the upper portion of the sidewall at a non-zero angle with respect to the sidewall.

9. The method of claim 8, wherein the angle is about 10 degrees or more and about 45 degrees or less.

10. The method of claim 1, wherein leaving the upper portion of the sidewall exposed comprises leaving the upper portion of the sidewall exposed between the top and about half way between the top and the substrate.

11. The method of claim 1, wherein forming the sidewall spacer comprises forming the sidewall spacer to a height of about 600 Å or more.

12. A method of forming a transistor gate in a semiconductor device, the method comprising:

forming a polysilicon gate structure over a semiconductor substrate, the polysilicon gate structure comprising a top and a sidewall;

forming a sidewall spacer adjacent a lower portion of the sidewall proximate the substrate leaving an upper portion of the sidewall exposed; and providing dopants to at least the exposed upper portion of the sidewall.

13. The method of claim 12, wherein providing dopants to at least the exposed upper portion of the sidewall comprises performing an implantation process at a non-zero angle with respect to the sidewall.

14. The method of claim 13, wherein the angle is about 10 degrees or more and about 45 degrees or less.

15. The method of claim 13, wherein performing the implantation process comprises providing dopants to the exposed portion of the semiconductor substrate in the prospective source/drain region, the upper portion of the sidewall, and the top of the polysilicon gate structure.

16. The method of claim 13, wherein forming the sidewall spacer comprises depositing spacer material over the polysilicon gate structure and the semiconductor substrate, and removing a portion of the spacer material to expose the upper portion of the sidewall and the top of the polysilicon gate structure prior to providing dopants to at least the upper portion of the sidewall.

17. The method of claim 16, wherein removing a portion of the spacer material comprises performing an etch process to expose the upper portion of the sidewall and the top of the polysilicon gate structure.

18. The method of claim 16, wherein removing a portion of the spacer material comprises performing an etch process to expose a portion of the semiconductor substrate in a prospective source/drain region, the upper portion of the sidewall, and the top of the polysilicon gate structure prior to doping the polysilicon gate structure, and wherein performing the implantation process comprises providing dopants to the exposed portion of the semiconductor substrate in the prospective source/drain region, the upper portion of the sidewall, and the top of the polysilicon gate structure.

19. A method of fabricating transistors in a semiconductor device, the method comprising:

forming a polysilicon gate structure over a semiconductor substrate, the polysilicon gate structure comprising a top and sidewalls extending from the top toward the semiconductor substrate;

depositing spacer material over the polysilicon gate structure and the semiconductor substrate;

selectively removing a portion of the spacer material using a first etch process to form sidewall spacers adjacent the sidewalls, the sidewall spacers covering lower portions of the sidewalls and exposing upper portions of the sidewalls, the top of the polysilicon gate structure, and the semiconductor substrate in at least one prospective source/drain region;

performing a source/drain implantation at an angle to dope the polysilicon gate structure and the exposed semiconductor substrate in the at least one prospective source/drain region;

removing a remaining portion of the spacer material using a second etch process; and performing an LDD implantation to further dope the polysilicon gate structure and the exposed semiconductor substrate in the at least one prospective source/drain region.

20. The method of claim 19, wherein performing the source/drain implantation comprises providing dopants to at least the upper portion of the sidewalls at a non-zero angle with respect to the sidewalls.

21. The method of claim 20, wherein the angle is about 10 degrees or more and about 45 degrees or less.

22. The method of claim 20, wherein performing the source/drain implantation comprises providing/dopants to the exposed portions of the semiconductor substrate the upper portions of the sidewalls, and the top of the polysilicon gate structure at a non-zero angle with respect to the sidewalls.

* * * * *